United States Patent [19]

Khan

[11] Patent Number: 4,931,672
[45] Date of Patent: Jun. 5, 1990

[54] TRUE TTL TO TRUE ECL BI-DIRECTIONAL TRISTATABLE TRANSLATOR DRIVER CIRCUIT

[75] Inventor: Aurangzeb K. Khan, San Bruno, Calif.

[73] Assignee: Tandem Computers Incorporated, Cupertino, Calif.

[21] Appl. No.: 318,435

[22] Filed: Mar. 3, 1989

Related U.S. Application Data

[63] Continuation of Ser. No. 123,486, Nov. 20, 1987, abandoned.

[51] Int. Cl.$^5$ ................. H03K 19/092; H03K 19/086; H03K 19/00
[52] U.S. Cl. .................................... 307/475; 307/473; 307/443; 307/455; 307/467
[58] Field of Search ............... 307/475, 473, 443, 455, 307/456, 457, 458, 466, 467, 355, 362

[56] References Cited

U.S. PATENT DOCUMENTS

| | | | |
|---|---|---|---|
| 4,527,079 | 7/1985 | Thompson | 307/475 |
| 4,654,549 | 3/1987 | Hannington | 307/456 |
| 4,677,320 | 6/1987 | Hannington | 307/473 |

*Primary Examiner*—Stanley D. Miller
*Assistant Examiner*—Trong Quang Phan
*Attorney, Agent, or Firm*—Townsend and Townsend

[57] ABSTRACT

The present invention provides an integrated circuit that has both driver and receiver functions. The circuit of the present invention has two interrelated parts. The first part of the circuit converts true TTL signals to true ECL signals. The second part of the circuit accepts true ECL signals and drives a tri-state true TTL bus. The novel design of the present invention provides a common circuit that acts as an input reference for the circuit that converts true TTL signals to true ECL signals and as a tri-state clamp for the circuit that accepts true ECL signals and drives a tri-state true TTL bus. Using the same circuit components to perform functions in two separate circuits reduces the component count of the resulting circuit and increases the circuit's power/device count figure of merit.

19 Claims, 3 Drawing Sheets

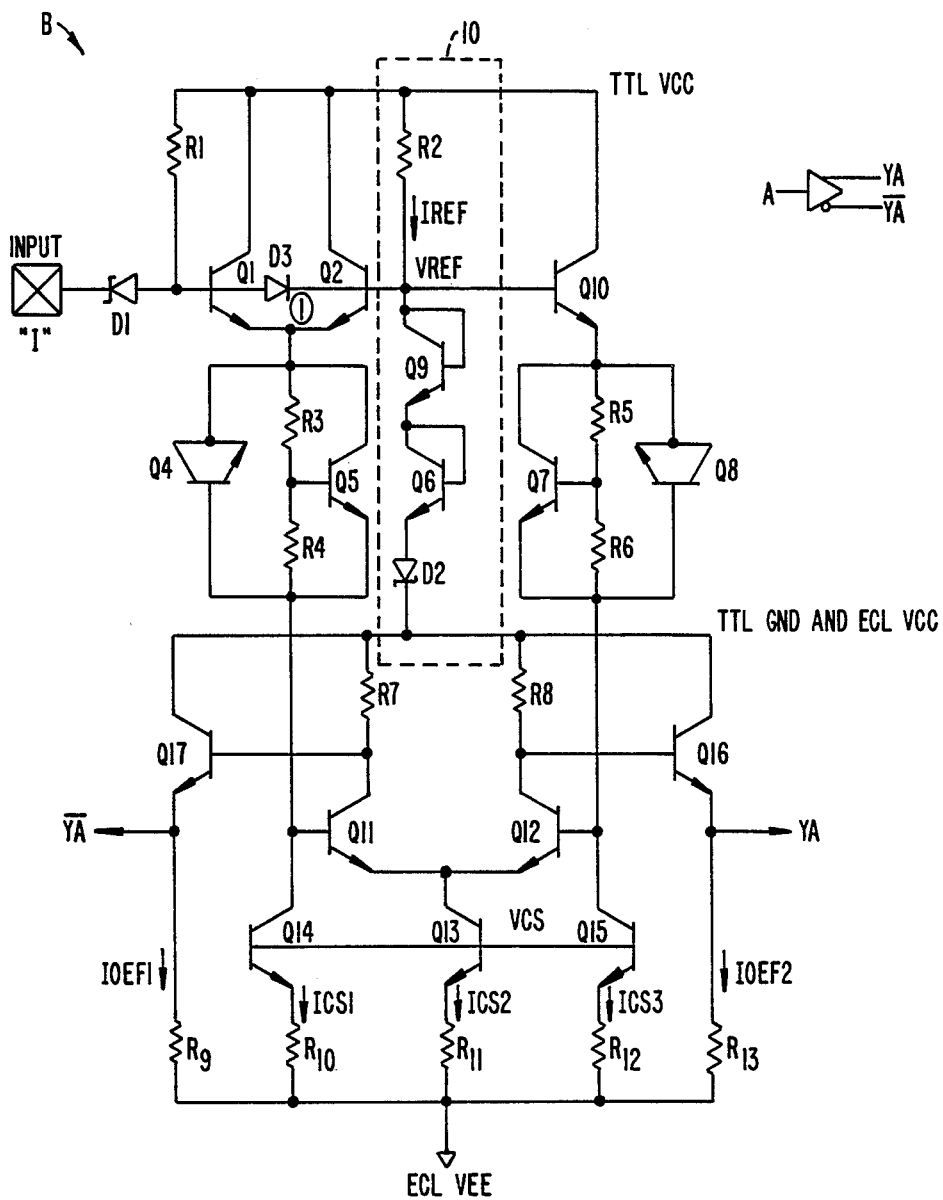
FIG._1.

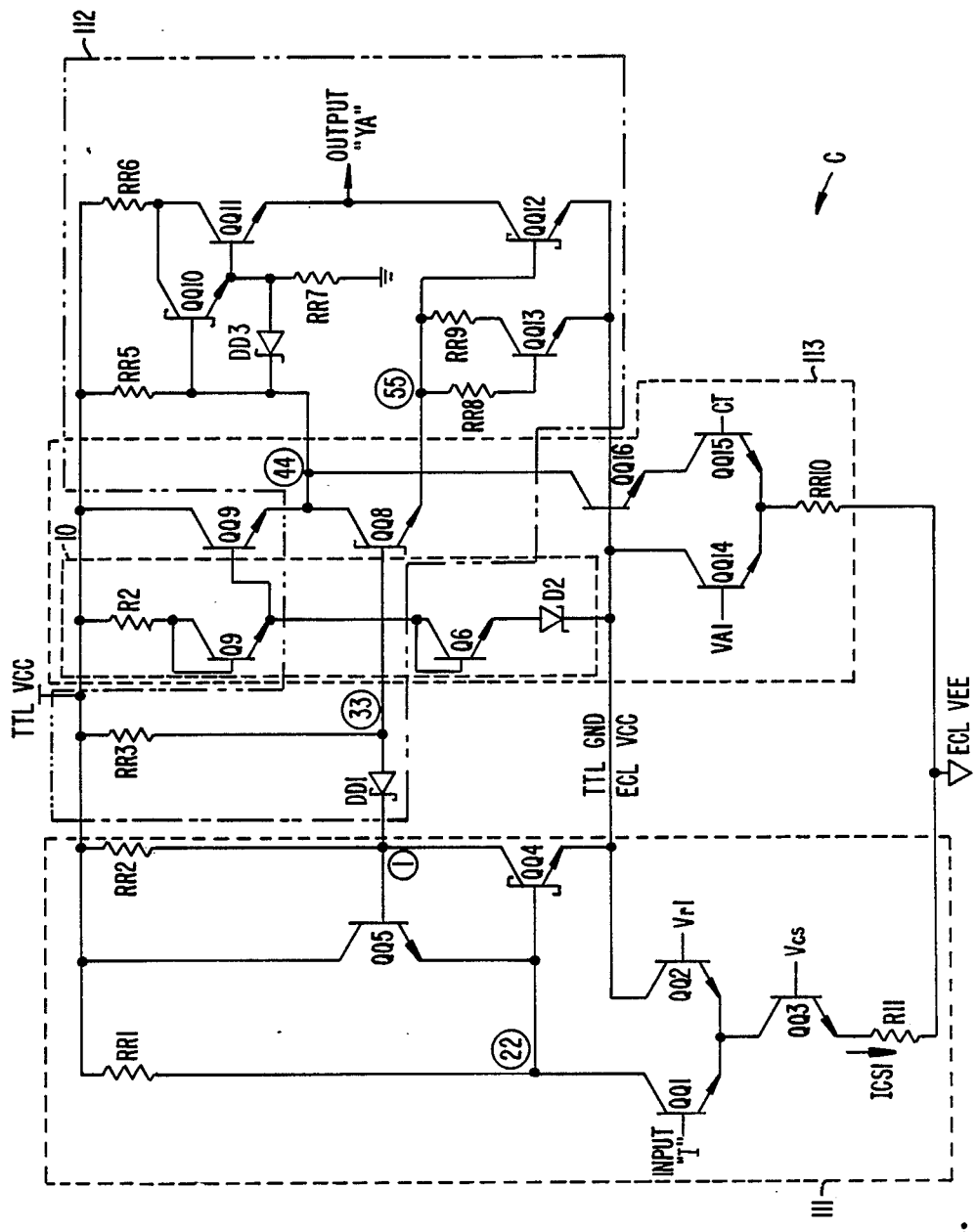
FIG._2.

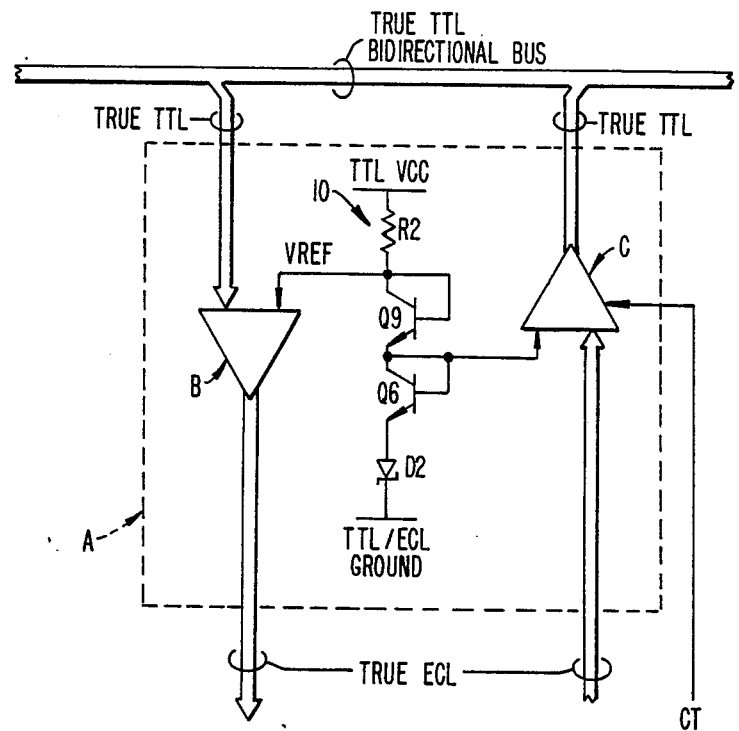
FIG._3.

TRUE TTL TO TRUE ECL BI-DIRECTIONAL TRISTATABLE TRANSLATOR DRIVER CIRCUIT

This is a continuation of application Ser. No. 07/123,486, filed Nov. 20, 1987, now abandoned.

TECHNICAL FIELD

The present invention relates to integrated circuits, and, more particularly, to circuits for translating from Emitter Coupled Logic (ECL) to Transistor-Transistor Logic (TTL).

BACKGROUND AND PRIOR ART

Many present day digital computers include bi-directional buses for transmitting data and control signals to and from various sub systems. Such systems often include integrated circuits connected to the bus which have bi-directional drivers/receivers, or transceivers connected to the same signal pad or pin. In such systems the transceiver functionality is achieved by connecting the output drivers output circuit line and the input receivers input circuit line to the same I/O signal pad or pin.

For example, copending application Ser. No. 07/123,507 filed Nov. 20, 1987, and now U.S. Pat. No. 4,806,800 entitled "True TTL to True ECL Input Translator Driver Circuit" shows a receiver circuit, and copending application Ser. No. 07/123,093 filed Nov. 20, 1987 entitled "True and now U.S. Pat. No. 4,857,776 TTL Output Translator Driver with True ECL Tri-State Control" shows a driver circuit. The two circuits shown in these applications could be connected to the same I/O signal pad or pin.

Many integrated circuit chips are I-O bound, that is, the area of the chip is controlled by the number of I-O bonding pads required to get signals on and off the chip. In such chips, there generally is adequate space for the actual logic circuits. However, in some modern technology such as TAB technology, the I-O bonding pads are very closely spaced and there are substantially more I-O bonding pads available. In such circuits the area density of the I-O logic circuits becomes a critical factor. Stated differently, the smaller the area required for I-O units, the smaller the overall chip dimensions possible. Such chip dimensions are desirable because they result in higher yield and lower cost.

The present invention addresses the problem of I-O circuit cell density in a situation where a common bonding pad is used for a bi-directional driver/receiver. Conventional transceivers which have two distinct functional circuit blocks, that is, a separate receiver circuit and a separate driver circuit, are relatively high in both component count and in use of silicon chip real estate. High component count and high use of silicon chip real estate has negative implications with respect to parameters such as die size, chip cost, yield, chip logic functional capability, etc.

OBJECTS OF THE PRESENT INVENTION

An object of the present invention is to provide a low cost, high density driver/receiver integrated circuit.

Another object of the present invention is to provide a driver/receiver that uses a relative small amount of silicon real estate.

Yet another object of the present invention is to provide a combined receiver/driver circuit for a bi-directional bus.

A still further object of the present invention is to provide a driver/receiver integrated circuit that can interface true ECL logic to a bi-directional true TTL bus.

SUMMARY OF THE INVENTION

The present invention provides an integrated circuit that has both driver and receiver functions. The circuit of the present invention has two interrelated parts. The first part of the circuit converts true TTL signals to true ECL signals. The second part of the circuit accepts true ECL signals and drives a tri-state true TTL bus. One novel aspect of the design of the present invention provides a common circuit that acts as an input reference for the circuit that converts true TTL signals to true ECL signals and as a stable tri-state clamp for the circuit that accepts true ECL signals and drives a tri-state true TTL bus. Using the same circuit components to perform functions in two separate circuits reduces the component count of the resulting circuit and increases the circuit's power/device count figure of merit.

DESCRIPTION OF THE DRAWINGS

FIG. 1 shows the true TTL to true ECL converter part of an embodiment of the invention.

FIG. 2 shows the tri-state control circuit part of an embodiment of the invention.

FIG. 3 shows in block diagram form, the combined circuit of the present invention.

DETAILED DESCRIPTION

The terms "true TTL" and "true ECL" are used herein in the conventional sense. The terms "true TTL" and "true ECL" positively distinguish from the terms "pseudo TTL" and "pseudo ECL". In general, true TTL voltages are in the range of zero to plus five volts, and true ECL voltages are negative in the range of zero to minus two volts. Pseudo TTL voltages have a five volt difference between the high and low states, but the voltages are negative, that is, pseudo TTL signals are from zero to minus five volts. Pseudo ECL signals have about a two volt range, but they are positive, that is, they range from zero to plus two volts.

Copending application Ser. No. 07/123507 filed Nov. 20, 1987 entitled "True TTL to True ECL Input Translator Driver Circuit" shows a separate receiver circuit. Copending application Ser. No. 07/123,093 filed Nov. 20, 1987 entitled "True TTL Output Translator Driver with True ECL Tri-State Control" shows a separate driver circuit. The circuits shown in the above two patent applications can be used separately, or both circuits can be placed on the same chip and connected to the same I/O bonding pad and package pin. The present invention provides a combined circuit that performs the same function as would be performed by both circuits.

The two circuits shown in the above-referenced patent applications can be combined in a novel manner to provide an economical circuit that performs both functions utilizing a minimum of components and a minimum amount of chip real estate. Such a combined circuit, designated with the reference letter A, is shown in FIG. 3 is block diagram form.

In the novel circuit of the present invention, the I/O transceiver (i.e., the receiver and the tri-state bus driver) a is one combined circuit. The output driver driver, designated C in FIG. 3, and the input receiver, designated B, are implemented using the techniques explained in the previously referenced patent applications. However, the circuits are combined in a unique way to achieve lower cost in device count and silicon real estate compared to the conventional solution of using two independent circuits.

As shown in FIG. 3, resistor R2, transistors Q9 and Q6, and diode D2 form a part of both circuits.

As FIG. 3 illustrates, the circuit elements R2, Q9, Q6, and D2 (cumulatively designated with the reference numeral 10) perform joint functions for the receiver circuit B and the tri-state bus driver circuit C. The circuit 10 develops a reference voltage ($V_{REF}$) against which input signal I (FIG. 1) is compared in the receiver B. At the same time, as will be discussed below with reference to the description and operation of the tri-state bus drive circuit C (FIG. 2, the circuit 10 operates to develop a clamp voltage that is used to hold the output circuits of the tri-state bus driver C in a stable, high-impedance state when the ECL signal control signal CT is asserted.

The detailed operation of the circuit shown in FIG. 1 will first be explained. Next, the detailed operation of the circuit shown in FIG. 2 will be explained. Finally, the operation of the combined circuit shown in FIG. 3 will be explained.

The input function, that is, the translation of true TTL signals to true ECL signals is performed by the circuit shown in FIG. 1. The circuit in FIG. 1 includes resistors R1 to R13, transistors Q1 to Q16, and diodes D1 and D2. The circuit shown in FIG. 1 operates as follows:

True TTL Input Reference Voltage Threshold

Devices D2, Q6, Q9 and R2, which cumulatively form the circuit 10 (FIG. 3), define the input reference threshold for the TTL input circuit.

$$Vref = Vsd(D2) + Vbe(Q6) + Vbe(Q9) \qquad (i)$$

Vbe is the nominal forward voltage of the bipolar transistor Q9 (and Q6), and Vsd is the nominal forward voltage of the Schottky barrier diode, D2 (and D1). The Vbe, Vsd voltages are set by the device characteristics as a function of the device current. Device current is set by, $$VCC - Iref*R2 - Vbe(Q9) - Vbe(Q6) - Vsd(D2) = 0$$

$$Iref = \{VCC - Vbd(Q9) - Vbel(Q6) - Vsd(D2)\}/R2$$

Let Vbe(Q6) = Vbe(Q7) = Vbe and Vsd(D2) = Vsd(D1) = Vsd, by design.

$$Vref = Vsd + 2Vbe, \text{ and } V(Q2) = Vref. \qquad (ii)$$

In this way, this circuit section provides the base of Q2 with Vref = ~2Vbe+Vsd. Note that the true reference voltage as observed at the input is 2Vbe, since Vsd(D2) and Vsd(D1) cancel.

The performance of this circuit across the voltage temperature stress envelope tracks the behavior of the conventional circuit. Thus, this reference introduces no new system level electrical design constraints.

True TTL Input Clamped Level-Shifting Comparator

Devices R1, Q1, Q2 and D3 are used to develop a small, ECL-like voltage at the emitter-tie node, labelled node 1, from the large TTL input voltage transitions. This is accomplished as follows.

Let the input "I" be at VIL, where, with respect to TTL GND, $$VILmin = 0.0 \text{ V} \leq = VIL \leq = 0.8 \text{ V} = VILmax$$

Then, D1 conducts IIL current, which is defined by, $$IIL = \{VCC - Vsd(D1) - VIL\}/R1$$

Consequently, the base of Q1 attains a voltage, $$Vb(Q1) = VIL + Vsd.$$

From the analysis presented above (Eq. ii) it should be noted that, $$Vb(Q2) = Vref = Vsd + 2Vbe. \qquad (iii)$$

Since 2Vbe is a higher voltage than VIImax, Vb(Q1) is lower than Vb(Q2). Therefore, transistor Q2 develops a full Vbe and goes into forward-active conduction, while transistor Q1 attains < 0.5Vbe and is considered cut-off. Hence, V(1) follows Vb(Q2), and the current source Ics1 (Q14/R10) is satisfied by Q2, via R3, R4 and Q5. In this way, the V(1) low level is established.

$$V(1) \text{ LOW} = Vbe + Vsd. \qquad (iv)$$

Next, let the input "I" be at VIH, where, with respect to TTL GND, $$VIHmin = 2.0 \text{ V} \leq = VII \leq = 5.0 \text{ V} = VIHmax \qquad (v)$$

Since VIHmin is a higher voltage than 2Vbe, D1 conducts reverse-leakage current only. IIH current is conducted through R1 to D3 into the input reference voltage circuit.

$$IIH = \{VCC - Vbe (D3) - Vref\}/R1$$

Diode D3 (which, in implementation, is the base-emitter junction of a transistor) acts as a clamp on Vb(Q1), such that with the input at any voltage greater than VIHmin, e.g., 3Vbe, $$Vb(Q1)max = Vbe(D3) + Vref = Vbe(D3) + 2-Vbe + Vsd \qquad (vi)$$

$$Vb(Q1)max = 3Vbe + Vsd$$

From the analysis presented above (Eq. ii) it should be noted that, $$Vb(Q2) = Vref = Vsd + 2Vbe.$$

Vb(Q1) is a higher voltage than Vb(Q2). Therefore, transistor Q1 develops a full Vbe and goes into forwardactive conduction, while transistor Q2 attains < 0.5Vbe and is considered cut-off. Hence, V(1) follows Vb(Q1) and the current source Ics1 (Q14/R10) is satisfied by Q1, via R3, R4 and Q5.

In this way, the V(1) high level is established.

$$V(1)HIGH = 2Vbe + Vsd. \qquad (viii)$$

It should be clear from the operation of the circuit, as explained above, that this circuit is substantially different from the conventional TTL input comparator The conventional circuit utilizes the same comparator reference, but converts input voltage into pseudo-ECL levels, and then later converts these to true-ECL using the conventional resistor ladder approach. In the novel technique developed in this document, the input stage can be described as a clamped, switched emitter-follower.

Self-Centering Reference Threshold Translator

The operation of the Vref-translator circuit is as follows. Let Ics3 represent the current required to satisfy the current source set-up by Q15 and R12.

$$Ics3 = \{VCS - Vbe(Q15)\} / R12$$

Ics3 is sourced by the parallel combination of transistor Q7 and resistor R6. The Ics3 value must be chosen to provide adequate current to bias transistor Q7 in the forward-active mode while also allowing I(R6) to be satisfied. A first order approximation $$I(R6) = Vbe(Q7) / R6 \text{ and,}$$

$$Ie(Q7) = Ics3 - I(R6).$$

Note that Vbe(Q7) is in fact a function of Ie(Q7).

$$V(R5) = R5 * I(R6) + \{Ie(Q7) / (Hfe+1)\}$$

where Hfe is the current gain of Q7. Therefore, by an appropriate choice of R5, we can set-up an appropriate amount of total voltage level shift provided by this circuit. Let us choose, $$R5 : R6 = 2.5 : 1. \qquad (ix)$$

Then, if we define Hfe to be a large positive number, $$V(R5) = 2.5 * V(R6) = 2.5 * Vbe(Q7) \qquad (x)$$

Therefore, the total voltage translation from the emitter of transistor Q10 to the base of transistor Q12 is set to be 3.5Vbe.

From our earlier discussion (Eq. ii), $$Vref = Vsd + 2Vbe.$$

Hence, applying the voltage translation derived above, we find that, $$Vb(Q12) = Vref - Vbe(Q10)$$

$$Vb(Q12) = Vsd + 2Vbe - Vbe - 3.5Vbe, \text{ or,}$$

$$Vb(Q12) = Vsd - 2.5Vbe \qquad (xi)$$

Note the unusual configuration of transistor Q8. The base-emitter and base-collector junctions are reverse biased in parallel. In this way, a large value, space-efficient capacitor is obtained. In order to satisfy the current source Ics2, transistor Q12 must build up incremental base charge to attain an appropriate Vbe value. The Q8 capacitor, if sized properly, can transmit an appropriate amount of charge to the base of Q12 much faster than the R6, Q7 combination can, thus providing significant delay performance enhancement.

Clamped Level-Shifted Input Translator

Incoming TTL input signals are converted into a Vbe voltage delta at node 1, as described earlier. In this section, the operation of the V(1)-translator circuit is described.

Let Ics1 represent the current required to satisfy the current source set-up by Q14 and R10.

$$Ics1 = \{VCS - Vbe(Q14)\} / R10$$

Ics1 is sourced by the parallel combination of transistor Q5 and resistor R4. The Ics1 value must be chosen to provide adequate current to bias transistor Q5 in the forward-active mode, while also allowing I(R4) to be satisfied. A first order approximation, $$I(R4) = Vbe(Q5) / R4 \text{ and,}$$

$$Ie(Q5) = Ics1 - I(R4).$$

Note that Vbe(Q5) is in fact a function of Ie(Q5).

$$V(R3) = R3 * I(R4) + \{Ie(Q5) / (Hfe+1)\}$$

where Hfe is the current gain of Q5. Therefore, by an appropriate choice of R3, we can set up an appropriate amount of total voltage level shift provided by this circuit. Let us choose, $$R3 : R4 = 3 : 1. \qquad (xii)$$

Then, if we define Hfe to be a large positive number, $$V(R3) = 3 * V(R4) = 3 * Vbe(Q5) \qquad (xiii)$$

Therefore, the total voltage translation from node 1 to the base of transistor Q11 is set to be 4Vbe.

From our earlier dscussion (Eq. ii), $$Vref = Vsd + 2Vbe.$$

Hence, applying the voltage translation derived above, we find that, $$Vb(Q11) = V(1) - 4Vbe \qquad (xiv)$$

Applying the earlier V(I)HIGH and V(1)LOW limits, (Eqs. iv & viii) we find that, $$Vb(Q11)HIGH = V(1)HIGH - 4Vbe = Vsd - 2Vbe, \qquad (xv) \text{ and,}$$

$$Vb(Q11)LOW = V(1)LOW - 4Vbe = Vsd - 3Vbe \qquad (xvi)$$

Comparing Eqs. xv and xvi versus Eq. xi, we find that the original incoming TTL input VIL, VIH voltage values have been interpreted into ECL-type voltage values Vb(Q11)HIGH or Vb(Q11)LOW. Further, an appropriate reference with excellent inherent tracking across wide voltage temperature and process variations has also been created.

Note the unusual configuration of transistor Q4. The base-emitter and base-collector junctions are reverse biased in parallel. In this way, a large value, space efficient capacitor is obtained. When an input transition is detected, the Q4 capacitor, if sized properly, transmits an appropriate amount of charge to the base of Q11 much faster than the R4, Q5 combination can, thus providing significant delay performance enhancement. The output emitter followers Q17 / Ioef1 and Q16 / Ioef2 perform the normal voltage level-shifting and provide current drive capability.

True ECL Buffer Driver

The key to the optimal performance of this circuit lies in the creation of the Vb(Q11) and Vb(Q12) voltages as described above. Once those appropriately conditioned voltages are available, the ECL current switch operates in the normal manner. Resistors R7, R8 and R11, and transistors Q11, Q12 and Q13 form the ECL current switch. If Vb(Q11)>Vb(Q12), then Ics2 is satisfied from ECL VCC via R7, and Vb(Q17) attains an ECL LOW output level, while Vb(Q16) attains an ECL HIGH level. Conversely, if Vb(Q11)<Vb(Q12) then Ics2 is satisfied from ECL VCC via R8, and Vb(Q16) attains an ECL LOW output level, while Vb(Q17) attains an ECL HIGH level.

OUTPUT CIRCUIT

FIG. 2 shows the tri-state bus driver circuit C. The circuit shown in FIG. 2 accepts true ECL inputs and drives a tri-state true TTL bus. The circuit in FIG. 2 per se is described and claimed in copending application Ser. No. 07/123,093 entitled "True TTL Output Translator Driver with True ECL Tri-State Control" The description in the copending application is hereby incorporated by reference.

The tri-state bus driver circuit C shown in FIG. 2, consists of fifteen transistors QQ1 to QQ15, ten resistors RR1 to RR10, and three diodes DD1 to DD3. The circuit operates as follows:

The Input Section 111 As FIG. 2 illustrates, the tri-state bus driver circuit C has an (ECL) input section 111 that includes devices QQ1, QQ2, QQ3 and RR11 that operate to perform a current-steered switching function. If Vb(Q1)>Vrl, then transistor QQ1 develops a full Vbe and goes into forward-active conduction, while transistor QQ2 attains <0.5Vbe and is considered cut-off. Hence, current source Ics1 (QQ3/RR11) is satisfied by QQ1. If Vb(QQ1)<Vrl, then transistor QQ2 develops a full Vbe, and goes into forward-active conduction, while transistor QQ1 attains <0.5Vbe and is considered cut-off. Hence, current source Ics1 (QQ3/RR11) is satisfied by QQ2. Note that Vbe is the nominal forward voltage of the bipolar transistor QQ1 (and QQ2). The Vbe voltage is set by device characteristics as a function of device current. All devices in this circuit are designed to appropriate dimensions such that with the defined nominal emitter current, the transistors attain uniform Vbe voltages.

If Vb(QQ1)>Vrl, then the QQ1 emitter current, Ie(QQ1), is set by:

$$Ie(QQ1) = [Hfe / (Hfe+1)] * \{[VCS - Vbe(QQ3)] / RR11\} \quad (i)$$

If Vb(QQ1)<Vrl, then the QQ2 emitter current, Ie(QQ2), is set by, $$Ie(QQ2) = [Hfe / (Hfe+1)] * \{[VCS - Vbe(QQ3)] / RR11\} \quad (ii)$$

Let Vb(QQ1)<Vrl. Then, Ics1 is satisfied by ECL VCC through QQ2. In this case, resistor RR1 sources current I(RR1), $$I(RR1) = [TTL\ VCC - Vbe(QQ4)] / RR1 \quad (iii)$$

through TTL VCC, to the base of transistor QQ4. This excess base drive forces transistor QQ4 to transition from the forward-active mode to the saturation mode. Consequently, the Schottky diode, in parallel with the base-collector junction of transistor QQ4, clamps node 11 to a voltage greater than TTL GND by VCEsat. We define VCEsat to be 0.25Vbe. In this way, the V(1)LOW voltage level is established.

Let Vb(QQ1)>Vrl. Then, Ics1 is satisfied by TTL VCC through QQ1, RR1, QQ5 and RR2 as follows, $$Ic(QQ1) = \{[Hfe / (Hfe+1)]**2\} * Ics1, \quad (iv)$$

$$\text{and } Ic(QQ1) = I(RR1) + Ie(QQ5) \quad (v)$$

Resistor RR1 is chosen to be a sufficiently high value to ensure that, $$Ic(QQ1) * RR1 > TTL\ VCC - TTL\ GND. \quad (vi)$$

Consequently, RR1 alone cannot source Ic(QQ1) completely. When Ics1 is steered into the QQ1 path, V(2) begins to move downward toward TTL GND. Transistor QQ4 is no longer supplied an excess base current. It therefore returns to a forward-active mode from the saturated mode. Note that transistors QQ4 and QQ5 are configured to provide a strong stabilizing feedback such that node 11 attains a voltage V(1)=2Vbe. In this way, the V(1)HIGH voltage level is established.

True TTL Inverter / Output Driver

Devices DD1, DD3, QQ8, QQ10, QQ11, QQ12, QQ13, RR3, RR5, RR6, RR7, RR8 and RR9 are used to perform the TTL inverter/driver function. This is accomplished as follows.

Let $V(1) = V(1)LOW = VCEsat$. Then, Vsd(DD1) is established by the flow of current I(RR3), which is given by, $$TTL\ VCC - [I(RR3) * RR3] - Vsd(DD1) - VCEsat(QQ4) = \quad (vii)$$

$$I(RR3) = [TTL\ VCC - Vsd - VCESat] / RR3 \quad (viii)$$

Note that Vsd(DD1) is a slow function of I(RR3) at or near the nominal Vsd / Id operating point. I(RR3) is designed such that transistor QQ8 can be provided sufficient base current overdrive in one mode, and Schottky diode DD1 develops a nominal Vsd in the other mode. Now, since I(RR3) is conducted via diode DD1 and transistor QQ4 to TTL GND, $$Vb(QQ8) = VCEsat + Vsd \quad (ix)$$

However, in order for QQ12 to force a VCEsat voltage at the output YA, Vb(QQ8) needs to be, $$Vb(QQ8) = Vbe(QQ8) + Vbe(QQ12) \cong \sim 2Vbe \quad (x)$$

Since Vb(QQ8) < ~2Vbe, with reference to eqs. ix and x, we find that a full Vbe is not sustained across transistor QQ12. Therefore, transistors QQ8 and QQ12 are in the cut-off mode, and V(44) tends toward TTL VCC. As a result, the Darlington configured transistor pair, QQ10 & QQ11, acts as an emitter follower in driving the output YA. VOH(YA) is established as, $$VOH(YA) = TTL\ VCC - [I(RR5) * RR5] - Vbe(QQ10) - Vbe(QQ11) \quad (xi)$$

Let V(1)=V(1)HIGH= ~2Vbe. Then, Schottky diode DD1 is in the zero-biased mode, and the flow of current I(RR3) is given by, $$TTL\ VCC - [I(RR3) * RR3] - Vbe(QQ8) - Vbe(QQ12) = 0, \quad (xii)$$

$$I(RR3) = [\text{TTL VCC} - 2V_{be}]/RR3 \qquad (xiii)$$

Note that Vbe is a slow function of Ie at or near the nominal Vbe / Ie operating point. I(RR3) is designed such that transistor QQ8 can be provided sufficient base current overdrive to force it into the saturated mode.

$$V_b(QQ8) = V_{be}(QQ8) + V_{be}(QQ12) = \sim 2V_{be} \qquad (xiv)$$

which is exactly the value required at Vb(QQ8) in order for QQ12 to force a VCEsat voltage at the output YA. Since Vb(QQ8)=~2Vbe, with reference to eqs. x and xiv, we find that transistor QQ8 saturates such that V(44) tends to, $$V(44) = V_{CEsat}(QQ8) + V_{be}(QQ12) \qquad (xv)$$

In this case, the I(RR3) and I(RR5) currents are drawn from TTL VCC to TTL GND via transistors QQ12 and QQ13. I(RR3) and I(RR5) can be defined as, $$I(RR3) = [\text{TTL VCC} - 2V_{be}]/RR3 \qquad (xvi)$$

$$I(RR5) = [\text{TTL VCC} - V_{CEsat} - V_{be}]/RR3 \qquad (xvii)$$

From eq. xv, we note that the Darlington configured transistor pair, QQ10 & QQ11, is cut-off for all output voltages such that, $$VO(YA) + V_{be}(QQ11) + V_{be}(QQ10) > V_{CEsat}(QQ8) + V_{be}(QQ12) \qquad (xviii)$$

This inequality is satisfied for all legitimate TTL VOL values. Due to the combined I(RR3) and I(RR5) currents flowing through transistors QQ12 and QQ13, both devices operate in the saturated mode. Consequently, VOL(YA) is established as, $$VOL(YA) = V_{CEsat}(QQ12) \qquad (xix)$$

Devices RR8, RR9 and QQ13 improve the edge transition delay performance of the circuit. Briefly, during the V(55) transition from ~0.5Vbe to Vbe, QQ13 attains a nominal forward-active Vbe later than transistor QQ121, thus reducing the time needed by QQ12 to move VO(YA) from VOH to VOL. When V(55) transitions from Vbe to 0.5Vbe, RR8, RR9 and QQ13 need to be designed such that QQ13 exists the saturated mode after QQ12 has transitioned from the saturated mode to cut-off mode.

In the analysis presented above, a single input A has been used to illustrate the inverter function. However, this circuit technique can also be extended to allow multiple input OR / NOR functions, as well as series-gated multiple input AND functions.

True ECL Tri-State Enable / Disable Control

The circuit combination formed by the components of circuit 10 (i.e., devices R2, Q9, Q6, and D2 - see also FIGS. 1 and 3) and devices QQ9, QQ14, QQ15, QQ16 and RR10 perform the fast tri-state control function. The current steering switch is designed to accept normal internal true ECL levels, referenced against Vr1. CT is the tri-state control input signal which operates at the nominal internal true ECL voltage levels.

If V(CT)<Vr1, then the current I(RR10) is provided by ECL VCC via transistor QQ14. In this case, I(RR10) is given by, $$I(RR10) = [V_{r1} - V_{be}(QQ14)]/RR10 \qquad (xx)$$

and the output is not tri-stated, but rather behaves as a TECL-to-TTTL inverter/translator driver.

If V(CT)>Vr1, then the current I(RR10) is provided by ECL VCC via transistors QQ16 and QQ15 from node 44. In this case, I(RR10) is, $$I_c(QQ16) = [(H_{fe}/H_{fe}+1)^{**}2]^* I(RR10) \qquad (xxi)$$

If the input A is at a low level, then V(1)=VCEsat and V(33)<2Vbe. Thus, transistor QQ8 is in the cut-off mode, and V(44) approaches TTL VCC. With this set-up, when CT is asserted, transistor QQ16 turns on to source I(RR10) via node 44. The current is initially sourced from resistor RR5. However, the value of resistor RR5 is chosen such that, $$I_c(QQ16) * RR5 > \text{TTL VCC} - \text{ECL VCC} \qquad (xxii)$$

Note that TTL GND and ECL VCC are connected together for this circuit, which is the normal condition. As the voltage at node 44 moves from TTL VCC toward ECL VCC / TTL GND transistor QQ9 transitions from the cut-off to the forward-active mode and effectively clamps V(44) at, $$V(44) = V_{sd}(DD2) + V_{be}(QQ7) - V_{be}(QQ9) \qquad (xxiii)$$

$$V(44) = V_{sd} \qquad (xxiv)$$

above TTL GND / ECL VCC. This V(44) voltage ensures that TTL output totem-pole top and bottom drivers are in the cut-off mode, thus ensuring that output YA is in the high impedance, tri-stated mode.

In this case, the Ic(QQ16) current is sourced by Ie(QQ9) and I(RR5) as follows, $$I_c(QQ16) = \{[\text{TTL VCC} - V(44)]/RR5\} + I_e(QQ9) \qquad (xxv)$$

If the input A is at a high level, then V(1)=~2Vbe, Schottky diode DD1 is zero-biased, and V(33)=~2Vbe. In this mode, current I(RR3) flows to the base of transistor QQ8 causing it to enter the saturated mode.

$$I(RR3) = [\text{TTL VCC} - V_{be}(QQ8) - V_{be}(QQ12)]/RR3 \qquad (xxvi)$$

Thus, transistor QQ8 effectively clamps V(44) at, $$V(44) = \sim V_{be} + V_{CEsat} \qquad (xxvii)$$

Now, with input A at a high level, when CT is asserted, transistor QQ16 turns on to source I(RR10) via node 44.

$$I_c(QQ16) = \{[H_{fe}/H_{fe}+1]^{**}2\}^* I(RR10) \qquad (xxviii)$$

In this case, the Ic(QQ16) current is sourced by I(RR3), Ie(QQ15) and I(RR5) as follows, $$I(RR3) = [\text{TTL VCC} - V_{sd}(DD2) - V_{sd}(QQ8)]/RR3 \qquad (xxix)$$

$$I(RR5) = [\text{TTL VCC} - V_{sd}]/RR5 \qquad (xxx)$$

$$I_c(QQ16) = I(RR3) + I(RR5) + I_e(QQ9) \qquad (xxxi)$$

I(RR10) is chosen such that, $$[I_c(QQ16) * RR5] > [TTL\ VCC - TTL\ GND] \quad \text{(xxxii)}$$

Thus, when CT is asserted and I(RR10) is sourced from node 44, V(44) begins to move toward TTL GND / ECL VCC until transistor QQ9 effectively clamps V(44) at, $$V(44) = V_{sd} \quad \text{(xxxiii)}$$

above TTL GND / ECL VCC. This V(44) voltage ensures that TTL output totem-pole top and bottom drivers are in the cut-off mode, thus ensuring that output YA is in the high impedance, tri-stated mode.

Combined Circuit:

FIG. 3 shows how the circuits in FIGS. 1 and 2 are combined in accordance the present invention. The present invention provides a combined circuit that performs the same function as would be performed by both the circuit in FIG. 1 and the circuit in FIG. 2; however, the combined circuit has less components than the sum of the components in the two individual circuits.

The novel circuit of the present invention provides an I/O transceiver (i.e., a receiver and a driver) in one combined circuit. The output driver and the input receiver functions are implemented using the techniques explained with reference to FIGS. 1 and 2; however, the circuits are combined in a unique way to achieve lower cost in device count and silicon real estate compared to the conventional solution using two independent circuits. As shown in FIG. 3, as well as FIGS. 1 and 2, resistor R2, transistors Q9 and Q6, and diode D2 form a part of both circuits. components shown in FIG. 3 replace resistor RR4, transistors QQ6 and QQ7, and diode DD2.

When combined as shown in FIG. 3, the two circuits operate in exactly the same manner as previously explained with respect to FIGS. 1 and 2; however, the combined device count is lower, thereby lowering the cost in terms of components and chip real estate.

While the invention has been particularly shown and described with reference to preferred embodiments thereof, it will be understood by those skilled in the art that the foregoing and other advantages in the form and detail may be made therein without departing from the spirit and the scope of the invention.

I claim:

1. A transceiver circuit for translating true ECL input signals to true TTL tri-state output signals and for translating true TTL input signals to true ECL output signals, the transceiver circuit comprising:
   (a) an ECL/TTL circuit for translating true ECL input signals, which have a HIGH state and a LOW state, and true ECL tri-state control signals, which have a HIGH state and a LOW state, to true TTL tri-state output signals which have a HIGH state, a LOW state, and a high impedance state, the ECL/TTL circuit comprising:
      (i) an ECL/TTL translator means for translating said true ECL input signals which have a HIGH state and a LOW state to corresponding true TTL signals which have a HIGH state and a LOW state;
      (ii) a TTL output driver means electrically coupled to the translator means for receiving said true TTL signals which have a HIGH state and a LOW state from said translator means and outputting corresponding true TTL tri-state output signals which have a HIGH state and a LOW state;
      (iii) a tri-state controller means electrically coupled to the TTL output driver means for quickly switching the TTL output driver means into a true TTL tri-state high impedance state based on said true ECL tri-state control signals without converting said true ECL tri-state control signals into TTL tri-state control signals;
   (b) a TTL/ECL circuit for translating true TTL input signals, which have a HIGH state and a LOW state, to true ECL output signals which have a HIGH state and a LOW state, the TTL/ECL circuit comprising:
      (i) an input reference means for defining an input reference threshold of the true TTL input signals which have a HIGH state and a LOW state;
      (ii) an input receiver circuit electrically coupled to the input reference means for translating true TTL input signals which have a HIGH state and a LOW state from said input reference means to corresponding true ECL signals which have a HIGH state and a LOW state;
      (iii) an ECL output driver means electrically coupled to the input receiver circuit for receiving true ECL signals which have a HIGH state and a LOW state from said input receiver circuit and outputting corresponding true ECL output signals which have a HIGH state and a LOW state.

2. The TTL/ECL circuit and the ECL/TTL circuit of claim 1, wherein the input reference means includes means for generating a clamp voltage, and wherein the TTL output driver means includes means coupled to receive the clamp voltage for holding the true TTL tri-state high-impedance state when the true ECL tri-state control signals are asserted.

3. The TTL output driver means and the tri-state controller means of claim 1 having at least one common circuit device.

4. The common circuit device of claim 3 being comprised of a transistor.

5. The transceiver circuit of claim 2 wherein the input reference means includes a plurality of semiconductor diode elements connected in series between a first voltage and a second voltage to form the generating means; a first one of the diode elements having a lead element at which is provided the clamp voltage.

6. The transceiver circuit of claim 5, wherein a second one of the diode elements includes a lead element at which is provided a reference voltage; the input reference means including comparing means for comparing the reference voltage to the true TTL input signals to determine the state thereof.

7. The transceiver circuit of claim 5, wherein the first and second diode elements are each formed from a transistor junction.

8. The transceiver circuit of claim 5, the transceiver circuit being formed as part of a single semiconductor chip.

9. In a digital system having TTL and ECL circuitry respectively producing true TTL and true ECL signals, apparatus for communicating the true TTL signals to the ECL circuitry and for communicating the true ECL signals to the TTL circuitry, the apparatus comprising:
    first circuit means coupled to receive the true TTL signals from the TTL circuitry for providing there-from to the ECL circuitry true ECL signals, the first circuit means having reference voltage generating means for generating first and second reference voltages, the first circuit means being operable to use the first reference voltage to define states of the received true TTL signals;

second circuit means coupled to the TTL and ECL circuitry for receiving and converting the true ECL signals to true TTL signals, the second circuit means having output circuit means including first and second output transistors connected provide a true TTL signal of a first state in response to a first true ECL signal and a true TTL signal of a second state in response to a second true ECL signal;

the second circuit means including tri-state control means coupled (1) to receive the second reference voltage, (2) to receive a true ECL control signal from the ECL circuitry, and (3) to the first and second transistors for placing the first and second transistors each in a high impedance state when the true ECL control signal is in a first control state.

10. The apparatus of claim 9, wherein the first and second reference voltages are established substantially by semiconductor elements.

11. The apparatus of claim 9, wberein the second reference voltage being established substantially by forward-biased junctions of semiconductor elements.

12. In a digital system of the type having a bi-directional TTL bus for communicating signaling in the form of true TTL signals, and ECL circuitry of the type using and generating true ECL signals, including an ECL control signal, apparatus coupling the ECL circuitry to the TTL bus for communicating the true TTL signals to the ECL circuitry as true ECL signals and true ECL signals to the TTL bus as true TTL signals, the apparatus comprising:

first circuit means coupling the TTL bus to the ECL circuitry for translating the true TTL signals to true ECL signals;

second circuit means coupling the ECL circuitry to the TTL bus for translating the true ECL signals to true TTL signals, the second circuit means including output circuit means coupled to the TTL bus for communicating the translated true TTL signals thereto; and tri-state control means having a control input connected to receive an ECL control signal and coupled to output means of the second circuit means for placing the output means in a high impedance state when the true ECL control signal is in a first state.

13. The apparatus of claim 12, including reference voltage generating means for generating a first reference voltage, the tri-state control means including means coupled to receive the first reference voltage for holding the output means in the high-impedance state when the true ECL control signal is in the first state.

14. The apparatus of claim 13, wherein the reference voltage generating means utilizes substantially semiconductor elements to generate the first reference voltage.

15. The apparatus of claim 13, wherein the reference voltage generating means operates to generate a second reference voltage, the first circuit means including means coupled to receive the second voltage for defining states of the true TTL signals.

16. The apparatus of claim 13, wherein the reference voltage generating means includes a plurality of semiconductor diode elements connected in series between a first voltage and a second voltage to form the generating means; a first one of the diode elements having a lead element at which is provided the first reference voltage.

17. The apparatus of claim 16, wherein a second one of the diode elements including a lead element at which is provide the second reference voltage.

18. The apparatus of claim 17, wherein the first and second diode elements are each formed from a transistor junction.

19. The transceiver circuit of claim 16, the apparatus being formed as part of a single semiconductor chip.

* * * * *